United States Patent [19]

Norman et al.

[11] Patent Number: 5,162,680
[45] Date of Patent: Nov. 10, 1992

[54] SENSE AMPLIFIER FOR PROGRAMMABLE LOGIC DEVICE

[75] Inventors: Kevin A. Norman, Belmont; Kunio Nishiwaki, San Jose, both of Calif.

[73] Assignee: Altera Corporation, San Jose, Calif.

[21] Appl. No.: 808,593

[22] Filed: Dec. 17, 1991

[51] Int. Cl.$^5$ .................... H03F 3/45; H03K 5/22
[52] U.S. Cl. .................... 307/530; 307/450; 307/549; 307/550; 307/354; 307/355; 307/362
[58] Field of Search ............ 307/530, 450, 549–550, 307/354–355, 362

[56] References Cited

U.S. PATENT DOCUMENTS

| | | | |
|---|---|---|---|
| 4,816,706 | 3/1989 | Dhong et al. | 307/530 |
| 4,899,070 | 2/1990 | Ou et al. | 307/530 |
| 4,962,342 | 10/1990 | Mead et al. | 307/530 |

Primary Examiner—Janice A. Howell
Assistant Examiner—Margaret R. Wambach
Attorney, Agent, or Firm—Jeffrey H. Ingerman

[57] ABSTRACT

A sense amplifier for detecting the voltage state (high or low) of the bit line of a programmable logic device with improved switching speed when the voltage state changes. When the bit line is high, a pull-up circuit including a cascode limits the maximum bit line voltage while isolating the output node from a supply of positive potential. At the same time, a transistor turned on by the high bit line voltage connects the output node to ground. An inverting amplifier on the output node produces an amplified output that follows the bit line. When the bit line is low, the conductance of a transistor gated by the bit line is substantially reduced, resulting in a relatively small conductance between the source line and ground, so that the source line potential rises significantly. The relatively large conductance between the bit line and source line as compared to the relatively small conductance between the source line and ground causes the potentials on the bit line and source line to approach one another and stabilize at a potential significantly above ground potential, so that the minimum voltage level on the bit line is also limited. The voltage on the bit line in the low state is too low to activate the transistors that connect the output node to ground, but it does activate a transistor that connects the output node to the supply of positive potential, pulling the output node high and the inverted amplified output low.

42 Claims, 2 Drawing Sheets

SENSE AMPLIFIER FOR PROGRAMMABLE LOGIC DEVICE

BACKGROUND OF THE INVENTION

This invention relates to programmable logic devices ("PLDs"), and more particularly to bit line sense amplifiers for PLDs.

Programmable logic devices are well known. Such a device frequently takes the form of an array of programmable interconnect elements. The array can be any size, including a single row, but it is not unusual for such an array to contain hundreds of rows and hundreds of columns. The array is based on a grid of orthogonal signal lines known as "bit lines" and "word lines". The programmable interconnect elements are typically erasable programmable read-only memories ("EPROMs"), such as electrically erasable programmable read-only memories ("EEPROMs") or ultraviolet erasable programmable read-only memories ("UVEPROMs"), although other types of programmable elements may be used. In a row of EPROMs extending in one direction, the gate of each EPROM is connected to a word line, while in an orthogonal row of EPROMs the drain of each EPROM is connected to a bit line. The source of each EPROM is connected to ground, typically through lines running parallel to the bit lines, although they could also run parallel to the word lines. The lines through which the sources are connected to ground, which may not actually be at ground potential, may be referred to as "common source lines", or just "source lines."

A user can "program" a desired bit in the array by placing a sufficient charge on the floating gate of the appropriate EPROM to prevent it from conducting even when its gate voltage (controlled by the word line) is high. Once the desired EPROMs have been programmed, a desired logical output can be obtained for a particular input to selected word lines.

One way of reading the output of the array is by sensing the status of each bit line with a circuit known as a sense amplifier, one of which is provided for each bit line. If none of the EPROMs connected to a particular bit line is conducting, the sense amplifier will indicate a high output (or a low if an inverting amplifier is used, as is typically the case). If any of the EPROMs is conducting, it will tend to bring the bit line voltage to ground, resulting in a low (or high) output.

One tends to think of the EPROMs as switches, so that if any EPROM is conducting, the bit line should be shorted to ground. However, each EPROM has impedance and, more importantly, capacitance, so that a conducting EPROM will have to discharge the capacitance of all of the non-conducting EPROMs connected to the same bit line. As a result, the bit line reaches ground faster if there are more EPROMs conducting (a state referred to as "super zero") than if only one is conducting ("weak zero"). Conversely, the transition from a super zero to a high state—i.e., from a state where many EPROMs are conducting to one where none is conducting—is also slow, because the capacitances of the EPROMs must be charged up from a relatively low initial potential, as compared to the transition from a weak zero state to a high state, where the capacitances of the same number of EPROMs must be charged, but from not quite so low an initial potential.

Many existing sense amplifiers are triggered to output a high or low signal based simply on a particular voltage level on the bit line. These sense amplifiers thus switch more slowly from the high state to the weak zero state than the from high state to the super zero state, and from the super zero state to the high state than from the weak zero state to the high state, because of the difference in elapsed time necessary to reach the switching voltage from the different states.

It would be desirable to be able to provide a sense amplifier having switching times that are substantially the same regardless of the initial state.

It would also be desirable to be able to provide circuitry for limiting the voltage swing on the bit line of a PLD to improve switching speed.

SUMMARY OF THE INVENTION

It is an object of this invention to provide a sense amplifier having switching times that are substantially the same regardless of the initial state.

It is also an object of this invention to provide circuitry for limiting the voltage swing on the bit line of a PLD to improve switching speed.

In accordance with this invention, there is provided, for use with a linear array of programmable interconnection devices, which programmable interconnection devices share common drain and source lines and have individual gate lines, a sense amplifier for determining the interconnection state of the array. The sense amplifier includes a supply of fixed positive electrical potential, a supply of ground electrical potential, and an output node. A first variable current limiting means is connected between the output node and the supply of fixed positive potential. A second variable current limiting means is connected between the output node and the source line and is controlled by the drain line. A third variable current limiting means is connected between the source line and the supply of ground potential and is controlled by the drain line. A variable pull-up means limits potential on the drain line and controls the first variable current limiting means responsive to potential on the drain line. When none of the programmable interconnections is conducting, potential on the drain line is limited to a first positive potential less than the fixed positive potential. The first positive potential is sufficient to cause the second and third variable current limiting means to conduct, such that the source line and the output node are at ground potential. When only one of the programmable interconnections is conducting, potential on the drain line falls from the first positive potential to a second positive potential insufficient to cause the second variable current limiting means to conduct thereby isolating the output node from the supply of ground potential. The second positive potential is sufficient for the third variable current limiting means to conduct slightly, which causes the source line to rise to a third positive potential as a result of the voltage drop across the third variable current limiting means caused by the current flowing therethrough. The variable pull-up means responds to the second positive potential by causing the first variable current limiting means to conduct, thereby raising the output node to the potential of the supply of fixed positive potential. As an increasing number of the programmable interconnections conducts, potential on the output node remains at the fixed positive potential and the drain and source lines approach a common potential above ground potential. At all times drain line potential remains between the common potential and the first positive potential, limiting maximum possible change in potential on the drain line, thereby minimizing switching time of the sense amplifier.

Instead of developing the entire switching potential on the bit line (the common drain electrode of the EPROMs), in the present invention half of the switching potential is developed on the drain line and the other half of the switching potential is developed on the source line. The two smaller potential differences result in quicker charging of the respective capacitances while the sum of the two potential differences is detected by the sense amplifier.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention is a sense amplifier circuit, for use with PLDs, that provides improved switching time as compared to previously known sense amplifiers. The sense amplifier of the invention achieves this improved switching time by actively limiting the voltage swing on the bit line which it is sensing, rather than passively sensing the voltage.

By limiting the maximum bit line voltage while still providing a low (or high) output when the bit line is at the lower maximum voltage, and by preventing the bit line voltage from going completely to ground in case of a bit line low while still providing a high (or low) output at the higher minimum voltage, the present invention decreases the time necessary for the bit line to complete its voltage swing in either direction, whether going to or from a weak zero or a super zero. As a result, the invention provides a more uniform response time to all bit line voltage changes.

Specifically, when the bit line is high, the preferred embodiment of the present invention holds the maximum bit line voltage to about 2 volts, well below the maximum $V_{cc}$ of 5 volts. In the case of a worst case downward transition, from high to weak zero, the bit line voltage is held to about 1.2 volts, rather than true ground. Thus, the response time is reduced from the time for a swing from 5 volts to ground to the time for a swing from about 2 volts to about 1.2 volts. In the case of a worst case upward transition, from super zero to high, again the voltage swing is from about 1.1 volts to about 2 volts instead of from ground to 5 volts. Of course, other voltages can be used and a voltage other than zero volts can be used for ground.

Figure 1:
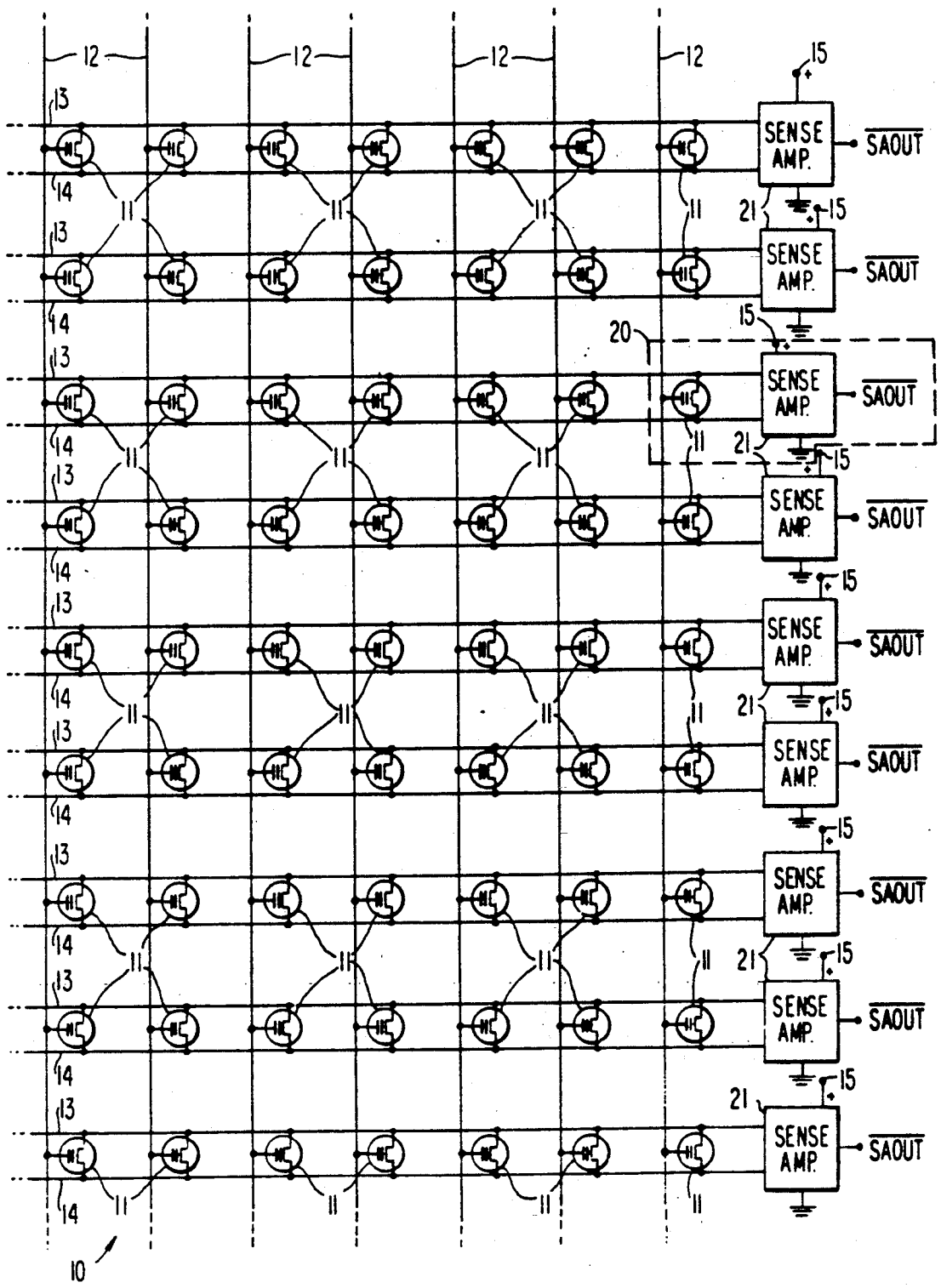
FIG. 1 is a schematic diagram of a portion of a programmable logic device with which the present invention can be used.

A portion of a programmable logic device 10 with which the present invention can be used is shown in FIG. 1. PLD 10 includes an array of programmable interconnect devices which, as shown, are preferably erasable programmable read-only memory (EPROM) transistors 11. EPROMs 11 are preferably arranged on a substantially orthogonal grid of gate lines 12 and drain lines 13, connected to the respective gate and drain of each EPROM. Parallel to each drain line 13 is a source line 14, connected to the respective source of each EPROM.

In many PLD applications, gate lines 12 are frequently referred to as word lines, while drain lines 13 are frequently referred to as bit lines. Source lines 14 are frequently referred to as ground lines, even where, as here, they are not truly grounded. Although ground lines may run parallel to word lines in some applications, the present invention is intended for use with PLDs in which the ground lines are parallel to the bit lines.

Figure 2:
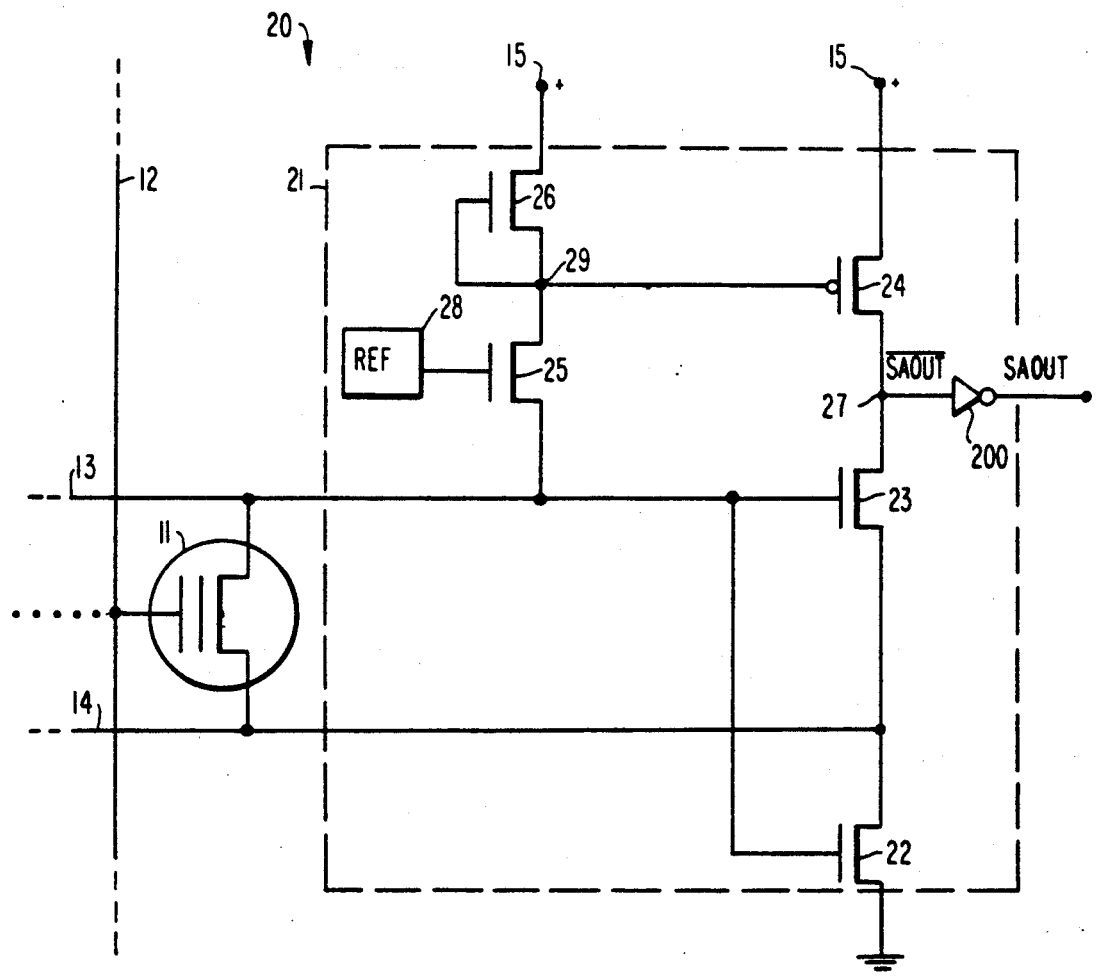
FIG. 2 is an enlarged schematic diagram of a portion of the PLD of FIG. 1 showing a preferred embodiment of the present invention.

In the preferred embodiment of the present invention, each drain line/source line pair 13, 14 is preferably connected to a sense amplifier 21, which in turn is preferably connected to true ground or to some other voltage used as ground, and to a supply 15 of fixed positive potential $V_{cc}$ and which has an output $\overline{SAOUT}$. The structure of the preferred embodiment of each sense amplifier 21 is shown in more detail in FIG. 2 which is an enlarged schematic diagram of area 20 of FIG. 1.

Preferably, sense amplifier 21 includes five field effect transistors ("FETs") 22, 23, 24, 25, 26. Transistors 22, 23 are preferably n-channel FETs, and transistor 24 is preferably a p-channel FET. Transistors 22, 23, 24 preferably operate in enhancement mode. Transistors 25, 26 are preferably n-channel FETs, preferably operating in depletion mode.

Transistor 22 has its source connected to ground and its drain connected to source line 14, while its gate is connected to drain line 13. Transistor 23 has its source connected to source line 14, its drain connected to output node 27, and its gate connected to drain line 13. Transistor 25 has its source connected to drain line 14 and its drain connected to the source and gate of transistor 26, as well as to the gate of transistor 24, and is configured as a cascode device, with its gate connected to a reference voltage supply 28. Transistor 26 has its source connected to its own gate and the gate of transistor 24, as well as to the drain of cascode 25, while its drain is connected to supply 15 of fixed positive potential $V_{cc}$. Transistor 24 has its drain connected to output node 27, its source connected to supply 15 of fixed positive potential $V_{cc}$, and its gate connected to the drain of cascode 25 and to the gate and source of transistor 26. The node at which the gate of transistor 24, the drain of cascode 25, and the gate and source of transistor 26 all meet is referred to as the pull-up node 29. Preferably, $V_{cc}$ supply 15 is at about 5 volts, reference supply 28 is at about 1 volt, and the threshold voltage of cascode 25 is about $-1$ volt.

Sense amplifier 21 preferably also includes inverting amplifier 200 connected to output node 27.

Sense amplifier 21 preferably operates as follows:

When no EPROMs are conducting (i.e., no gate line 12 of any unprogrammed EPROM is high), drain line 13 is high, being pulled up by $V_{cc}$ through transistor 26 which, in its source-to-gate feedback configuration is always conducting, and cascode 25. However, cascode 25 pinches off when the voltage on drain line 13 reaches 2 volts, as its gate to source voltage exceeds $-1$ volts. Thus drain line 13 is held at 2 volts. A potential of 2 volts on drain line 13 causes both transistors 22, 23 to conduct, bringing output node 27 to ground as desired for bit line high ($\overline{SAOUT}$ is low and SAOUT, which follows bit or drain line 13, is high), while node 27 remains isolated from $V_{cc}$ because pull-up node 29 is high, keeping transistor 24 turned off and non-conducting. Thus $\overline{\text{SAOUT}}$ is low as expected for drain line high, while inverted amplified output SAOUT of amplifier 200 is high.

With sense amplifier 21 in this state, as EPROMs along drain line 13 begin to conduct, the potential on drain line 13 will begin to drop as drain line 13 is discharged through the conducting EPROMs toward the potential of source line 14. At the same time, the potential on source line 14 will begin to rise as source line 14 is charged through the conducting EPROMs toward the potential of drain line 13. As the first EPROM begins to conduct, because it is the only unprogrammed EPROM in the row to whose gate line 12 a positive potential (at least about 3 volts in the preferred embodiment) is applied, the circuit enters the "weak zero" case.

As EPROM 11 tries to short drain line 13 to source line 14 in the weak zero case, drain line 13 begins to drop relatively slowly from 2 volts as the capacitance of all of the non-conducting EPROMs is discharged. When the potential difference between drain line 13 and source line 14 drops to less than one enhancement threshold voltage (about 0.8 volt in the preferred embodiment), transistor 23 turns off, isolating output node 27 from ground. At the same time, cascode 25 begins to conduct again as its gate-to-source voltage rises above $-1$ volt. As a result, there are four impedances in series between $V_{cc}$ and ground—viz., transistors 26 and 25, EPROM 11 and transistor 22—forming a voltage divider that begins to pull down the voltage of pull-up node 29. The actual rate and magnitude of the voltage divider effect is determined by the sizes of the various devices in the circuit, which are chosen to provide the desired result. When pull-up node 29 has been pulled down sufficiently far to turn transistor 24 on again, transistor 24 immediately pulls output node 27 high. Thus, a rapid response of sense amplifier 21 to a weak zero transition is achieved.

In a transition from high to "super zero", in which a relatively large number of EPROMs 11 on drain line 13 begin to conduct (because they are not programmed and a positive potential—again preferably at least about 3 volts—has been applied to their respective gate lines 12), sense amplifier 21 will respond similarly to its response in the weak zero case, with the potential on drain line 13 tending to discharge to the potential of source line 14, leading to a high output at node 27, as above. However, because there are more conductances in parallel between drain and source lines 13, 14 in the super zero case, the capacitive discharge tends to be faster and tends to pull the potential of drain line 13 lower. Such a result is undesirable because it would cause an unacceptably long charge-up time in a transition back to the drain line high state. Therefore, in accordance with the preferred embodiment of the invention, the potential on drain line 13 is prevented from falling too low by the feedback effect of transistor 22. Because transistor 22 is gated by drain line 13, if the potential on drain line 13 falls too low, the conductance of transistor 22 is substantially reduced, resulting in a relatively small conductance between source line 14 and ground, so that the source line potential rises significantly. The relatively large conductance between drain line 13 and source line 14 compared to the relatively small conductance between source line 14 and ground causes the potentials on drain line 13 and source line 14 to tend toward each other, stabilizing at a potential above ground potential (e.g., about 1.1 volts) on both drain and source lines 13, 14. Because of the present invention, therefore, the potential on drain line 13 does not fall all the way to ground, or even as close to ground as in a conventional device, and the response of sense amplifier 21 when drain line 13 makes the transition back to high is faster both because drain line 13 is starting from a higher potential and because drain line 13 need not rise so far to reach the maximum potential allowed by the present invention (e.g., 2 volts).

The signal developed on drain line 13 varies from about 2 volts in the high state to about 1.2 volts on the weak zero state, gradually decreasing to 1.1 volts in the super zero state. It is apparent that the signal swing between the high state and any zero state occurs significantly on both drain line 13 and source line 14, while the signal swing between a weak zero state and a super zero state occurs primarily on source line 14. This invention is based on the way that the difference in potential between source line 14 and drain line 13 is sensed by transistor 23 as a function of whether source line 14 and drain line 13 differ in potential by more or less than the threshold voltage of transistor 23.

One can see that the potential on drain line 13 is always higher in either a weak zero or super zero case than it is in traditional circuits, while that potential is lower in the high state than it is in traditional circuits, with the overall potential swing between the two cases being reduced, in turn reducing the switching time of sense amplifier 21 as compared to previously known sense amplifiers.

Thus it is seen that a sense amplifier having switching times that are substantially the same regardless of the initial state, and with which the voltage swing on the bit line of a PLD is limited to improve switching speed, is provided. One skilled in the art will appreciate that the present invention can be practiced by other than the described embodiments, which are presented for purposes of illustration and not of limitation, and the present invention is limited only by the claims which follow.

What is claimed is:

1. For use with a linear array of programmable interconnection devices, said programmable interconnection devices sharing common drain and source lines and having individual gate lines, a sense amplifier for determining the interconnection state of said array, said sense amplifier comprising:

a supply of fixed positive electrical potential;

a supply of ground electrical potential;

an output mode;

first variable current limiting means connected between said output node and said supply of fixed positive potential;

second variable current limiting means connected between said output node and said source line and being controlled by said drain line;

third variable current limiting means connected between said source line and said supply of ground potential and being controlled by said drain line; and variable pull-up means for limiting potential on said drain line and for controlling said first variable current limiting means responsive to potential on said drain line; wherein:

when none of said programmable interconnections is conducting, potential on said drain line is limited to a first positive potential less than said fixed positive potential, said first positive potential being sufficient to cause said second and third variable current limiting means to conduct, such that said source line and said output node are at ground potential;

when only one of said programmable interconnections is conducting, potential on said drain line falls from said first positive potential to a second positive potential insufficient to cause said second variable current limiting means to conduct thereby isolating said output node from said supply of ground potential, said second positive potential being sufficient for said third variable current limiting means to conduct slightly, thereby causing potential on said source line to rise to a third positive potential as a result of potential drop across said third variable current limiting means caused by current flowing therethrough, said variable pull-up means responding to said second positive potential by causing said first variable current limiting means to conduct, thereby raising said output node to the potential of said supply of fixed positive potential; and as an increasing number of said programmable interconnections conducts, potential on said output node remains at said fixed positive potential and said drain and source lines approach a common potential above ground potential; whereby:

at all times said drain line potential remains between said common potential and said first positive potential, limiting maximum possible change in potential on said drain line, thereby minimizing switching time of said sense amplifier.

2. The sense amplifier of claim 1 wherein each of said variable current limiting means comprises a transistor.

3. The sense amplifier of claim 2 wherein said transistor is a field effect transistor.

4. The sense amplifier of claim 3 wherein said first variable current limiting means comprises a p-channel field effect transistor.

5. The sense amplifier of claim 4 wherein said p-channel field effect transistor is in enhancement mode.

6. The sense amplifier of claim 3 wherein said second variable current limiting means comprises an n-channel field effect transistor.

7. The sense amplifier of claim 6 wherein said n-channel field effect transistor is in enhancement mode.

8. The sense amplifier of claim 3 wherein said third variable current limiting means comprises an n-channel field effect transistor.

9. The sense amplifier of claim 8 wherein said n-channel field effect transistor is in enhancement mode.

10. The sense amplifier of claim 1 wherein said variable pull-up means comprises cascode means connected between said drain line and said supply of fixed positive potential.

11. The sense amplifier of claim 10 wherein said cascode means comprises a transistor and a supply of reference potential connected to a control input of said transistor.

12. The sense amplifier of claim 11 wherein said cascode transistor is an n-channel field effect transistor and said control input is the gate of said field effect transistor.

13. The sense amplifier of claim 12 wherein said n-channel field effect transistor is in depletion mode.

14. The sense amplifier of claim 10 wherein said variable pull-up means further comprises a pull-up transistor connected between said cascode means and said supply of fixed positive potential, an output of said pull-up transistor configured to feed back to an input of said pull-up transistor, said output also connected to a control input of said first variable current limiting device.

15. The sense amplifier of claim 14 wherein said pull-up transistor is an n-channel field effect transistor with its gate connected to its source, to said cascode means and to said control input of said first variable current limiting device, and its drain connected to said supply of fixed positive potential.

16. The sense amplifier of claim 15 wherein said pull-up transistor is in depletion mode.

17. The sense amplifier of claim 1 wherein said programmable interconnection devices are EPROMs.

18. The sense amplifier of claim 17 wherein said EPROMs are EEPROMs.

19. The sense amplifier of claim 17 wherein said EPROMs are Flash EPROMs.

20. The sense amplifier of claim 1 further comprising an amplifier at said output node for producing an amplified output.

21. A programmable logic device comprising:
a bit line conductor;
a supply of ground electrical potential;
a source line conductor;
a plurality of word line conductors, each of which conducts an associated word line signal;
a plurality of programmable interconnection devices, each of which, if programmed, is insensitive to the word line signal on a respective one of said word line conductors associated with said programmable interconnection device, and, if not programmed, is controlled by the word line signal on said respective associated word line to selectively connect said bit line conductor to said source line conductor; and
a sense amplifier for determining the selective connection state of said programmable interconnection devices associated with said array; said sense amplifier comprising:
a supply of fixed positive electrical potential;
an output node;
first variable current limiting means connected between said output node and said supply of fixed positive potential;
second variable current limiting means connected between said output node and said source line and being controlled by said bit line;
third variable current limiting means connected between said source line and said supply of ground potential and being controlled by said bit line; and
variable pull-up means for limiting potential on said bit line and for controlling said first variable current limiting means responsive to potential on said bit line; wherein:
when none of said programmable interconnections is conducting, potential on said bit line is limited to a first positive potential less than said fixed positive potential, said first positive potential being sufficient to cause said second and third variable current limiting means to conduct, such that said source line and said output node are at ground potential;
when only one of said programmable interconnections is conducting, potential on said bit line falls from said first positive potential to a second positive potential insufficient to cause said second variable current limiting means to conduct thereby isolating said output node from said supply of ground potential, said second positive potential being sufficient for said third variable current limiting means to conduct slightly, thereby causing potential on said source line to rise to a third positive potential as a result of potential drop across said third variable current limiting means caused by current flowing therethrough, said variable pull-up means responding to said second positive potential by causing said first variable current limiting means to conduct, thereby raising said output node to the potential of said supply of fixed positive potential; and as an increasing number of said programmable interconnections conducts, potential on said output node remains at said fixed positive potential and said bit line and said source line approach a common potential above ground potential; whereby:

at all times said bit line potential remains between said common potential and said first positive potential, limiting maximum possible change in potential on said bit line, thereby minimizing switching time of said sense amplifier.

22. The programmable logic device of claim 21 wherein each of said variable current limiting means comprises a transistor.

23. The programmable logic device of claim 22 wherein said transistor is a field effect transistor.

24. The programmable logic device of claim 23 wherein said first variable current limiting means comprises a p-channel field effect transistor.

25. The programmable logic device of claim 24 wherein said p-channel field effect transistor is in enhancement mode.

26. The programmable logic device of claim 23 wherein said second variable current limiting means comprises an n-channel field effect transistor.

27. The programmable logic device of claim 26 wherein said n-channel field effect transistor is in enhancement mode.

28. The programmable logic device of claim 23 wherein said third variable current limiting means comprises an n-channel field effect transistor.

29. The programmable logic device of claim 28 wherein said n-channel field effect transistor is in enhancement mode.

30. The programmable logic device of claim 21 wherein said variable pull-up means comprises cascode means connected between said drain line and said supply of fixed positive potential.

31. The programmable logic device of claim 30 wherein said cascode means comprises a transistor and a supply of reference potential connected to a control input of said transistor.

32. The programmable logic device of claim 31 wherein said cascode transistor is an n-channel field effect transistor and said control input is the gate of said field effect transistor.

33. The programmable logic device of claim 32 wherein said n-channel field effect transistor is in depletion mode.

34. The programmable logic device of claim 30 wherein said variable pull-up means further comprises a pull-up transistor connected between said cascode means and said supply of fixed positive potential, an output of said pull-up transistor configured to feed back to an input of said pull-up transistor, said output also connected to a control input of said first variable current limiting device.

35. The programmable logic device of claim 34 wherein said pull-up transistor is an n-channel field effect transistor with its gate connected to its source, to said cascode means and to said control input of said first variable current limiting device, and its drain connected to said supply of fixed positive potential.

36. The programmable logic device of claim 35 wherein said pull-up transistor is in depletion mode.

37. The programmable logic device of claim 21 wherein said programmable interconnection devices are EPROMs.

38. The programmable logic device of claim 37 wherein said EPROMs are EEPROMs.

39. The programmable logic device of claim 37 wherein said EPROMs are Flash EPROMs.

40. The programmable logic device of claim 21 further comprising an amplifier at said output node for producing an amplified output.

41. For use with a linear array of programmable interconnection devices, said programmable interconnection devices sharing common drain and source lines and having individual gate lines, a sense amplifier for determining the interconnection state of said array, said sense amplifier comprising:

a supply of fixed positive electrical potential;
a supply of ground electrical potential;
a supply of reference potential;
an output node;
a first enhancement mode n-channel field effect transistor having a source connected to said supply of ground potential, a drain connected to said source line, and a gate connected to said drain line;
a second enhancement mode n-channel field effect transistor having a source connected to said source line, a drain connected to said output node, and a gate connected to said drain line;
a cascode comprising a depletion mode n-channel field effect transistor having a source connected to said drain line and a gate connected to said supply of reference potential, and having a drain;
a depletion mode n-channel field effect pull-up transistor having a drain connected to said supply of fixed positive potential and having a gate and a source, said gate being connected to said source;
an enhancement mode p-channel field effect transistor having a source connected to said supply of fixed positive potential and a drain connected to said output node, and having a gate; and
a pull-up node at which said drain of said cascode, said source of said pull-up transistor and said gate of said p-channel transistor are connected.

42. The sense amplifier of claim 41 further comprising an amplifier at said output node for producing an amplified output.

* * * * *